United States Patent
Kim et al.

[11] Patent Number: 6,087,763
[45] Date of Patent: Jul. 11, 2000

[54] ELECTRONIC COMPONENT INVOLVING 3-TERMINAL TYPE PIEZO-ELECTRIC DEVICE

[75] Inventors: Jong Sun Kim; Il Yong Yun, both of Suwon-si, Rep. of Korea

[73] Assignee: Samsung Electro-Mechanics Co., Ltd., Kyongki-do, Rep. of Korea

[21] Appl. No.: 08/972,541

[22] Filed: Nov. 18, 1997

[30] Foreign Application Priority Data

| May 28, 1997 | [KR] | Rep. of Korea | 97-12232 |
| May 28, 1997 | [KR] | Rep. of Korea | 97-12233 |
| May 28, 1997 | [KR] | Rep. of Korea | 97-12235 |
| May 29, 1997 | [KR] | Rep. of Korea | 97-12452 |
| Oct. 24, 1997 | [KR] | Rep. of Korea | 97-54883 |

[51] Int. Cl.$^7$ ................................... H01L 41/04
[52] U.S. Cl. .......................... 310/348; 310/351
[58] Field of Search ........................ 310/351, 353, 310/348; 331/187

[56] References Cited

U.S. PATENT DOCUMENTS

| 5,091,671 | 2/1992 | Yoshida | 310/358 |
| 5,184,043 | 2/1993 | Yoshinaga | 310/320 |
| 5,345,136 | 9/1994 | Takagi et al. | 310/348 |
| 5,596,244 | 1/1997 | Kugou et al. | 310/348 |
| 5,805,397 | 9/1998 | Kotani | 310/348 |

FOREIGN PATENT DOCUMENTS

| 3-28596 | 6/1991 | Japan . |
| 5-33847 | 5/1993 | Japan . |

*Primary Examiner*—Nestor Ramirez
*Assistant Examiner*—Peter Medley
*Attorney, Agent, or Firm*—Lowe Hauptman Gopstein Gilman & Berner

[57] ABSTRACT

An electronic component involving a 3-terminal type piezo-electric device is disclosed. The piezo-electric device connected to a first terminal, and a capacitor connected to both a second terminal and the outside of the first terminal are firmly supported by first and second supporting means, so that the connecting work can be easily carried out, and that the connection state can be firmly maintained, thereby upgrading the reliability of the electronic component involving the 3-terminal type piezo-electric device. The electronic component involving a 3-terminal type piezo-electric device includes a device part 110 having a piezo-electric device 111 and a capacitor 115. A terminal part 120 has a first terminal 123 with bent portions to surround both ends of the piezo-electric device 111 and to be connected to the capacitor 115, and a second terminal 124 for being connected to the outer face of the capacitor 115. A lead part 130 has first and second leads 132 and 136 and a frame 133 for integrally connecting the lower ends of the first and second leads 132 and 136. A supporting part 140 has first and second supporting means 141 and 142 extending downward integrally from the connecting portion between the first terminal 123 and the first lead 132.

8 Claims, 10 Drawing Sheets

ELECTRONIC COMPONENT INVOLVING 3-TERMINAL TYPE PIEZO-ELECTRIC DEVICE

BACKGROUND OF THE INVENTION

1. Field of the Invention

The present invention relates to an electronic component involving a 3-terminal device, in which a capacitor and a piezo-electric device utilizing the piezo-electric effect are installed on a circuit board. More specifically, the present invention relates to an electronic component involving a 3-terminal type piezo-electric device, in which the piezo-electric device connected to first terminals, and a capacitor connected to both a second terminal and to the outside of the first terminals are firmly supported by first and second supporting means, so that the connecting work can be easily carried out, and the connection state firmly maintained, thereby upgrading the reliability of the electronic component involving the 3-terminal type piezo-electric device.

2. Description of the Prior Art

Generally, a piezo-electric device resorts to the piezo-electric effect, i.e., to a mutual converting function between the electric energy and the mechanical energy. Thus the piezo-electric device serves as the operation source for reference signals of a microprocessor. This piezo-electric device is mostly used on electronic apparatuses such as pagers, mobile communication means, televisions, audio sets and the like. At present, its demand is speedily increased. The method for manufacturing an electronic device involving the piezo-electric device includes the steps of: manufacturing a piezo-electric device; forming electrodes by depositing and patterning an electrode layer on the surface of the piezo-electric device; installing the piezo-electric device on a circuit board; and molding the component by dotting and epoxy-coating, and finishing the product by marking the device.

The 3-terminal component includes: first terminals connected to the piezo-electric device for generating a resonance frequency; and a second terminal connected to a capacitor which is necessary in the circuit. Thus the piezo-electric device and the capacitor are unitizingly packaged. Therefore, the electronic component involving the piezo-electric device can be miniaturized. Thus the 3-terminal component in which the piezo-electric device and the capacitor are simultaneously connected is widely used.

Japanese Patent Publication No. Hei-5-33847 discloses a piezo-electric device having terminals. In this conventional technique, there is provided a 3-terminal piezo-electric device in which the two terminals mutually face to each other from both ends of the piezo-electric device so as to connect the piezo-electric device, and a third terminal is connected to a capacitor.

Figure 1:
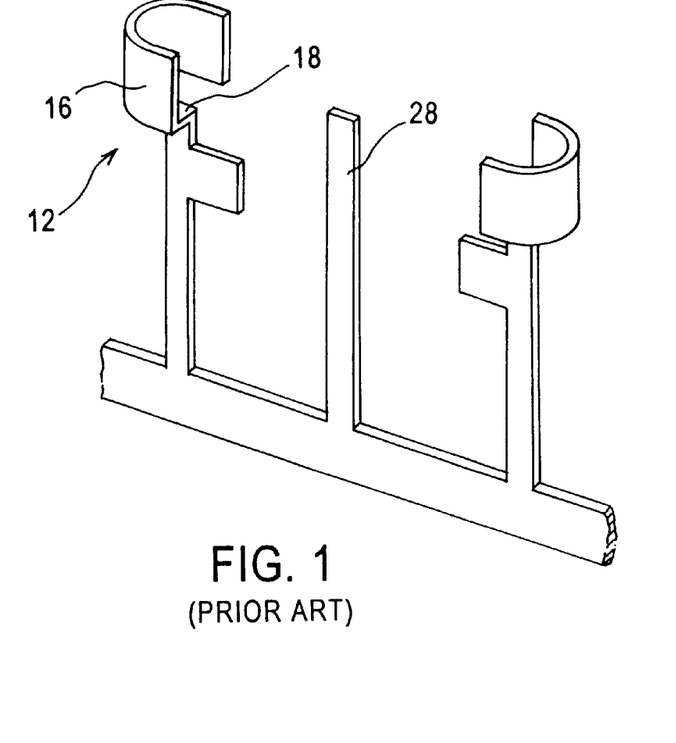
FIG. 1 is a perspective view of the terminals for a conventional 3-terminal type piezo-electric component.
Figure 2:
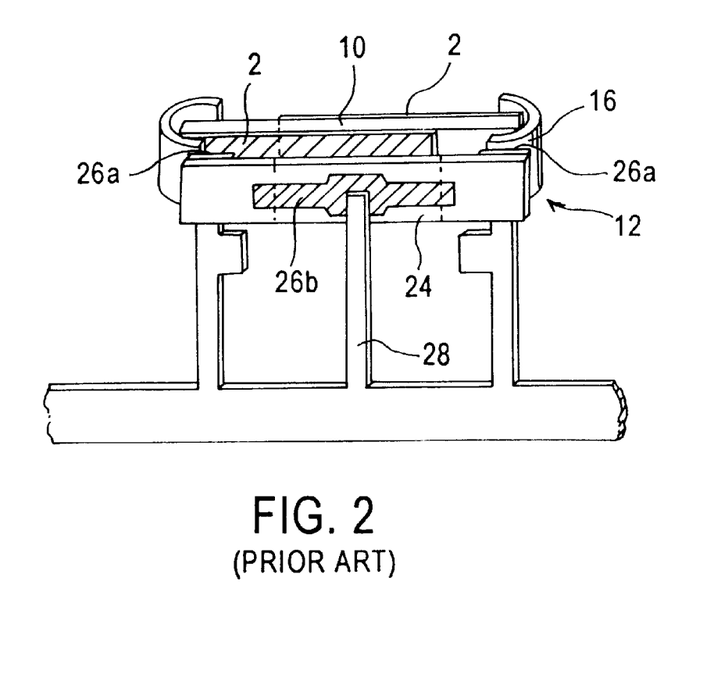
FIG. 2 is a perspective view showing the overall constitution of the conventional 3-terminal type piezo-electric component.

FIG. 1 is a perspective view of terminals of a conventional 3-terminal piezo-electric device. FIG. 2 is a perspective view showing the constitution of the entire portion of the conventional 3-terminal piezo-electric component.

As shown in FIGS. 1 and 2, the above described 3-terminal piezo-electric component includes: a piezo-electric resonance device 10 having electrodes 2 installed on different faces of it and extending on the both sides of it toward center of it; and two cup shaped terminals 12 having supporting portions 16 and installed opposingly facingly at positions corresponding to the ends of the piezo-electric resonance device 10, and electrically and mechanically connected to the electrodes 2 of the piezo-electric resonance device 10 by means of a conductive coupling material; a circuit board 24 connected electrically and mechanically to the outside of the two supporting portions 16 by means of a conductive coupling material; and another terminal 28 connected electrically and mechanically to the circuit board 24 by means of a conductive coupling material.

In the above described 3-terminal type piezo-electric component, as shown in FIGS. 1 and 2, the piezo-electric resonance device 10 having the electrodes 2 is electrically and mechanically connected by means of a conductive coupling material to the insides of the two cup shaped terminals 12 which have the supporting portions 16 and are opposingly facingly positioned correspondingly to the ends of the piezo-electric resonance device 10. One electrode 26a of the circuit board 24 is connected electrically and mechanically to the outsides of the supporting portions 16, while another electrode 26b of it is connected to another terminal 28.

However, in the above described 3-terminal type piezo-electric component as shown in FIGS. 1 and 2, the piezo-electric resonance device 10 is supported by the two cup shaped terminals 12 by being mounted on stoppers 18. Electrodes 26a of the circuit board 24 which is a capacitor are connected to the outsides of the cup shaped terminals 12, while another electrode 26b is connected to another terminal. However, the circuit board 24 is connected without any separate stopper, and therefore, the connection state between the circuit board 24 and the cup shaped terminal 12 becomes unstable. Further, the other electrode 26b of the circuit board 24 is closely contacted to the other terminal 28. Therefore, although the connecting work using the conductive coupling material can be easily carried out, the soldering becomes difficult due to the lack of the melting space.

Further, the connecting work of the supporting portions 16 of the cup shaped terminals 12 and the stopper portions 18 is possible, but a perfect bending is impossible in manufacturing the stoppers 18. Therefore, during a soldering, the molten soldering material flows down.

SUMMARY OF THE INVENTION

The present invention is intended to overcome the above described disadvantages of the conventional technique.

Therefore it is an object of the present invention to provide a 3-terminal type piezo-electric component in which a bent portion is formed on each of first terminals to easily fix a piezo-electric device, the connection between the piezo-electric device and the capacitor can be easily and firmly carried out by utilizing first and second supporting means, a projection of a second terminal makes it possible to easily carry out soldering the second terminal to the electrode of the capacitor so as to ease the manufacture of the electronic component, slots are formed on leads so as to ease the molding process, and the flowing-down of the soldering material can be prevented, thereby upgrading the reliability of the electronic component.

It is another object of the present invention to provide a 3-terminal type piezo-electric component in which the bottom of the piezo-electric device is firmly supported by the projected and inwardly bent supporting means of the first terminals, (which project beyond to the outsides of the first terminals), so that the piezo-electric device and a capacitor can be easily and firmly connected to the terminals by means of a single supporting means, thereby upgrading the workability.

In achieving the above objects, the electronic component involving a 3-terminal type piezo-electric device according to the present invention includes: a device part having a piezo-electric device with electrodes on both sides thereof in such a manner as to be overlapped at the middle portion, and having a capacitor with two electrodes on both ends of one face thereof and another electrode at a center of another face thereof; a terminal part having a first terminal with bent portions with a bending angle α around a center line s so as to surround both ends of the piezo-electric device, for being electrically connected to each of electrodes of the piezo-electric device, and for being electrically connected to each of electrodes of the capacitor, and having a second terminal for being electrically connected to an electrode of another face of the capacitor; a lead part having first and second leads extending downward from the inner lower ends of the first terminals and from the second terminal, and having a frame for integrally connecting the lower ends of the first and second leads; and a supporting part having a first supporting means, the first supporting means extending downward integrally from the connecting portion between the first terminal and the first lead in parallel with the first terminal, and being bent with a certain bending angle β to support the piezo-electric device, and having a second supporting means bent rectangularly from the first terminal to support the capacitor.

In another aspect of the present invention, the electronic component involving a 3-terminal type piezo-electric device according to the present invention includes: a device part having a piezo-electric device with electrodes on both sides of the piezo-electric device in such a manner as to be overlapped at the middle portion, and having a capacitor with two electrodes on both ends of one face thereof and another electrode at a center of another face thereof; a terminal part having a first terminal with bent portions with a bending angle α around a center line s so as to surround both ends of the piezo-electric device, for being electrically connected to each of electrodes of the piezo-electric device, and for being electrically connected to each of electrodes of the capacitor, and having a second terminal for being electrically connected to an electrode of another face of the capacitor; a lead part having first and second leads extending downward from the inner lower ends of the first terminals and from the second terminal, and having a frame for integrally connecting the lower ends of the first and second leads; and a supporting part having a supporting means, the supporting means extending downward integrally from the outer planar portion of the first terminal and rectangularly bent inwardly into the first terminal.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENTS

FIGS. 3 to 9 illustrate a first embodiment of the present invention.

The first embodiment provides an electronic component having a 3-terminal component 100 for simultaneously connecting a piezo-electric device 111 and a capacitor 115. The first embodiment of the present invention includes a device part 110, a terminal part 120, a lead part 130 and a supporting part 140.

Figure 3A:
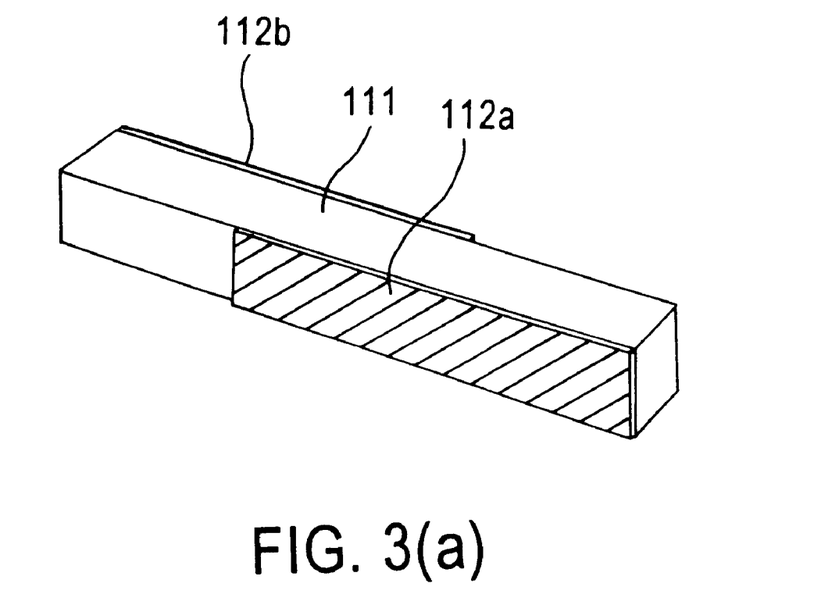
FIGS. 3a and 3b are plan views showing the piezo-electric device and the capacitor.
Figure 3B:
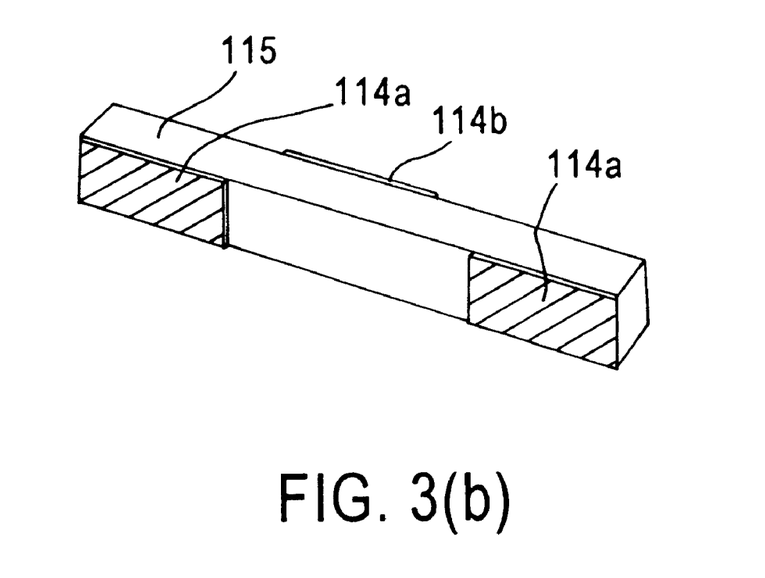
Figure 4:
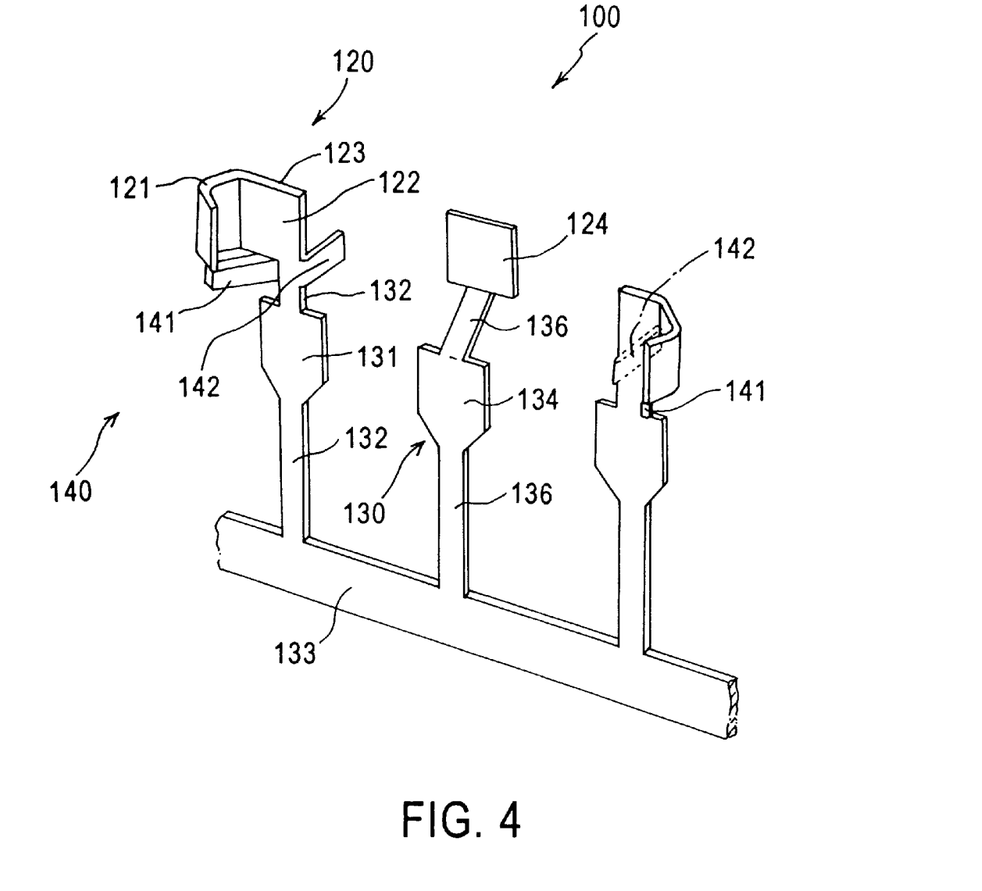
FIG. 4 is a perspective view showing the 3-terminal component for the piezo-electric device according to the present invention.
Figure 5:
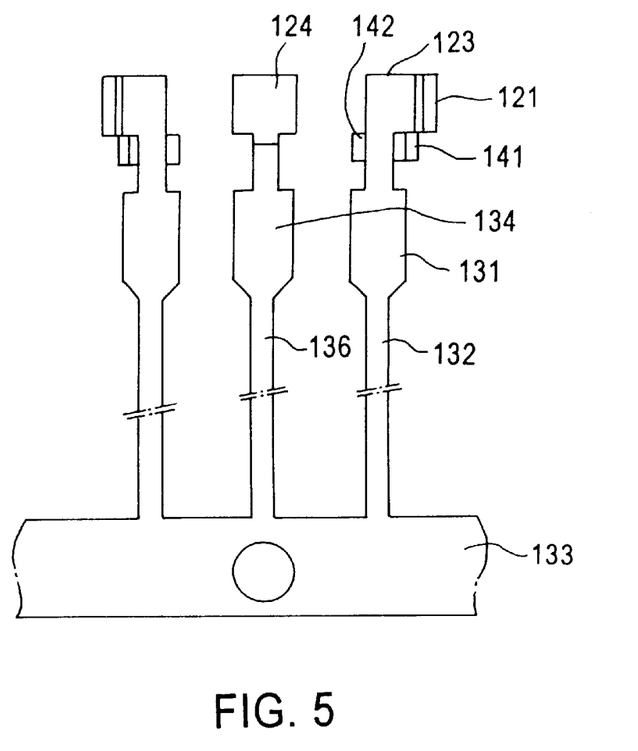
FIG. 5 is a frontal view of the 3-terminal component for the piezo-electric device according to the present invention.
Figure 6:
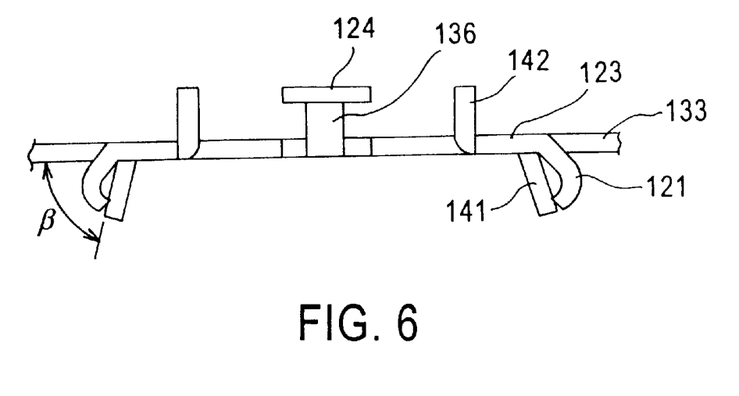
FIG. 6 is a plan view of the 3-terminal component for the piezo-electric device according to the present invention.

As shown in FIG. 3, in the device part 110 including the piezo-electric device 111 and the capacitor 115, piezo-electric device 111 is provided such that two electrodes 112a and 112b respectively extend from the ends of the piezo-electric device 111 along its opposite faces toward the center thereof to overlap at the center. The capacitor 115 is provided with electrodes 114a at both ends of one face thereof and another electrode 114b at the center the other face.

Further, as shown in FIGS. 4 to 9, the terminal part 120 which is connected to the piezo-electric device 111 and to the capacitor 115 includes a first terminal 123 provided at opposite ends of the terminal part to respectively contact both ends of the piezo-electric device 111. The first terminal 123 has an inward opening for coupling with one end of the piezo-electric device 111. To form the opening, the first terminal 123 has bent portions 121 with a bending angle α around a center line s. The insides of the first terminals 123 are electrically connected to electrodes 112a and 112b which are formed on both tips and side faces of the piezo-electric device 111. The outsides of the first terminals 123 are connected to electrodes 114a which are formed on both ends of one face of the capacitor 115. The second terminal 124 is connected to the electrode 114b which is formed at the center of another face of the capacitor 115. Openings 122 of the first terminals 123 face each other.

Figure 7:
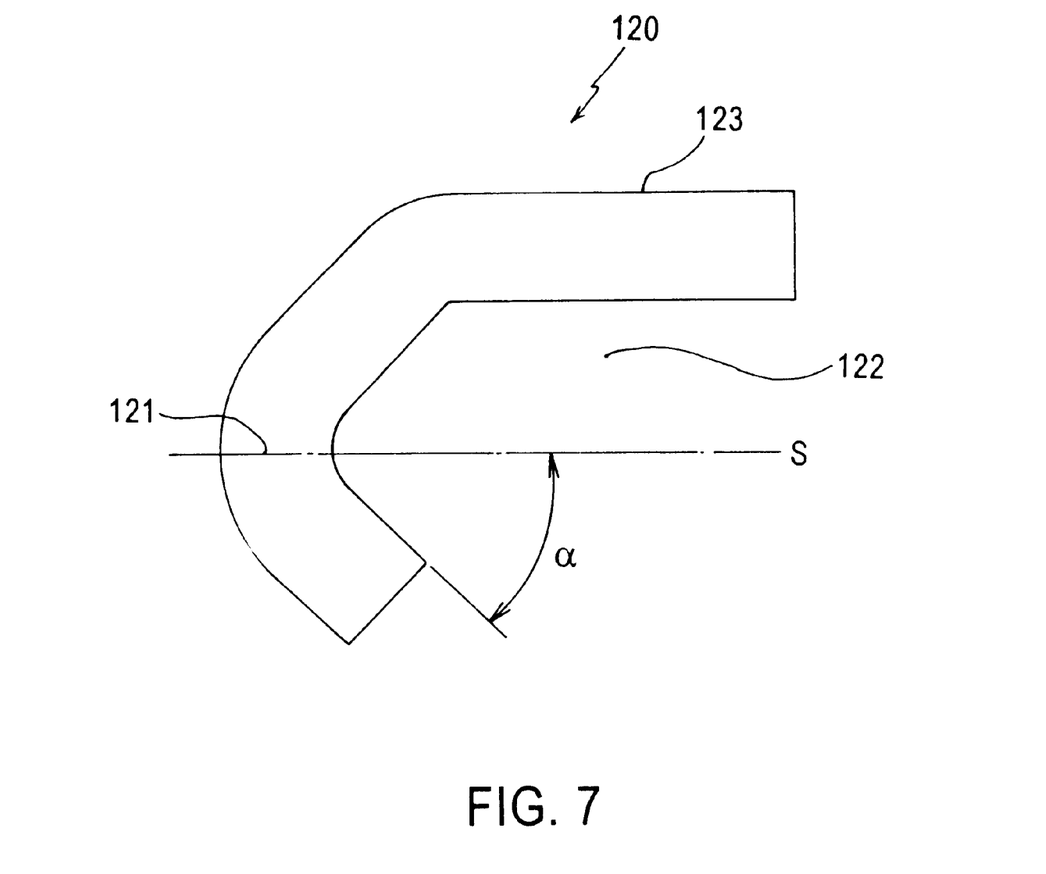
FIG. 7 is a plan view of the bent portions of the terminal in the 3-terminal component for the piezo-electric device according to the present invention.
Figure 8:
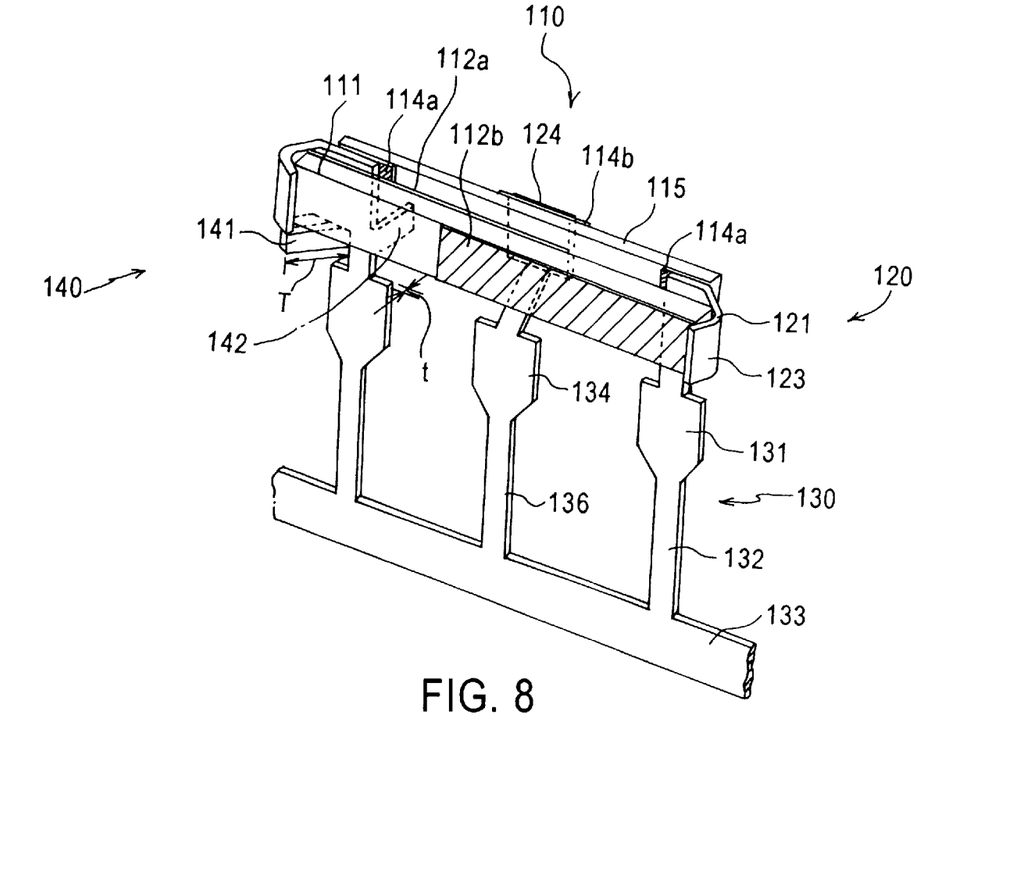
FIG. 8 is a perspective view showing a first embodiment of the present invention.
Figure 9:
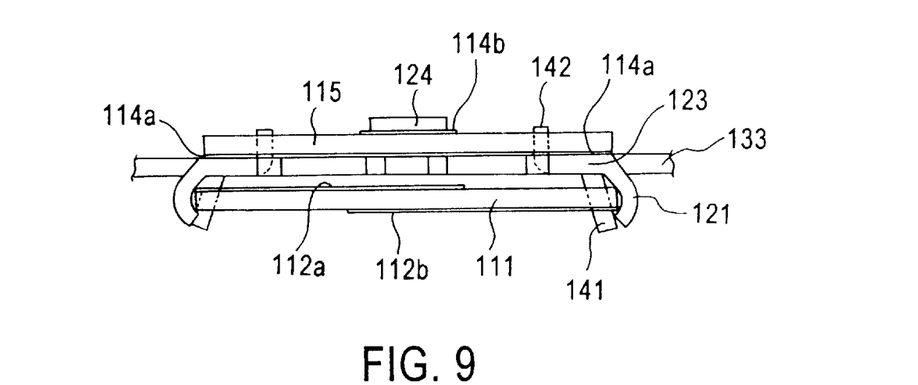
FIG. 9 is a plan view of the first embodiment of the 3-terminal component for the piezo-electric device according to the present invention.

The bending angle α of the bent portion 121 of the first terminal 123 is 40–45°, and preferably 42°. The bent portion 121 of the terminal part 120 is approximately V-shaped, with its inner middle portion being rounded.

The lead part 130 is for installing the terminal 123 onto a main circuit board (not shown in the drawings), with the terminal part 120 accommodating the piezo-electric device 111 and the capacitor 115.

As shown in FIGS. 4 to 9, the lead part 130 includes a first lead 132 extending downward from the inner lower end of the terminal 123 and having a reinforcing portion 131. The lower end of the first lead 132 joins with a frame 133 in an integral form. The lead part 130 further includes a second lead 136, and the second lead 136 is disposed between the first leads 132, and extends downward to join with the frame 133 in an integral form, while the second lead 136 is also provided with a reinforcing portion 134.

Further, the supporting part 140 which firmly supports the piezo-electric device 111 and the capacitor 115 includes first and second supporting means 141 and 142. The first supporting means 141 projects from the connection portion between the first terminal 123 and the first lead 132 transversely to the length of the piezo-electric device 111. The first supporting means 141 is bent inwardly into the terminal 123 with a bending angle β. The second supporting means 142 is bent outwardly from the first terminal 123 with an approximate rectangle.

The bending angle β of the first supporting means 141 is 83–87°, and preferably 85°. The length T of the first supporting means 141 should be larger than the thickness t of the first lead 132.

The first embodiment of the present invention constituted as above will now be described as to its action.

As shown in FIGS. 3 to 9, the electrodes 112a and 112b extend from the both ends of the piezo-electric device 111 along the opposite faces of it toward the middle of it, and the both ends of the piezo-electric device 111 are inserted into the first terminals 123 to be connected to them. Meanwhile, the electrodes 114a which are formed on both ends of the one face of the capacitor 115 are connected to the outsides of the first terminals 123, while the electrode 114b which is formed at the center of another face of the capacitor 115 is connected to the second terminal 124. The piezo-electric device 111 is made of a ceramic material. Therefore, if power is supplied to the piezo-electric device 111, a resonance frequency is generated from between the overlapped electrodes 112a and 112b. Thus the piezo-electric device serves as a piezo-electric resonance device, i.e., as an oscillation generating source. This is called a "ceramic oscillator".

Further, correspondingly with the both ends of the piezo-electric device 111, the first terminal 123 has bent portions 121 with a bending angle α around a center line s, and therefore both end portions of the piezo-electric device 111 are surrounded by the first terminals 123, and are fixed to the first terminals 123 by soldering or the like. The bending angle α of the bent portions 121 of the first terminal 123 should be 40–45°, and preferably should be 42°.

When both end portions of the piezo-electric device 111 are disposed within the bent portions 121 of the first terminals 123, the piezo-electric device 111 can be accurately positioned and fixed within the first terminals 123. Thus, the piezo-electric devices 111 can be fixed uniformly during the production, and any loose movement between the piezo-electric device 111 and the first terminals 123 can be prevented, thereby stabilizing the connection state, and improving the assembling process. Under this condition, if the bending angle α is less than 40°, the piezo-electric device 111 cannot be received into the first terminals 123. On the other hand, if the bending angle α is more than 45°, the openings 122 of the first terminals 123 become too large, and therefore, the fixing of the piezo-electric device 111 becomes unstable.

In order to reinforce the coupling between the piezo-electric device 111 and the first terminals 123, soldering is carried out. The bent portion 121 has an approximately V shaped rounded inside form to make it easy to carry out the soldering.

Further, the first and second leads 132 and 136 which extend from the inner lower end of the first and second terminals 123 and 124 are provided with reinforcing portions 131 and 134 respectively. The lower ends of the leads 132 and 136 join with the frame 133 in an integral form. Therefore, if the first leads 132 and the second lead 136 are installed on a main circuit board (not shown in the drawings), power can be supplied through the first leads 132 and the second lead 136 to the piezo-electric device 111 and to the capacitor 115. Due to the reinforcing portions 131 and 134, the strength and elasticity of the first leads 132 and the second lead 136 is improved.

Further, the first supporting means 141 projects from the connecting point between the first terminal 123 and the first lead 132 with a bending angle β to be extended to the tip of the first terminal 123. Meanwhile, the second supporting means 142 projects by being bent rectangularly outward from the first terminal 123. Therefore, the first and second supporting means 141 and 142 support both the piezo-electric device 111 and the capacitor 115, which have been connected to the first and second terminals 123 and 124. Thus the coupling state and the connection state of the piezo-electric device 111 and the capacitor 115 are more firmly maintained, and at the same time, molten soldering material is prevented from flowing down.

The bending angle β of the first supporting means 141 should be 83–87°, and preferably should be 85°. If the bending angle β is less than 83°, the first supporting means 141 is biased to the rear portion of the first terminal 123. On the other hand if it is more than 87°, the first supporting means 141 is biased to the front portion of the first terminal 123. Consequently, the supporting and fixing state of the piezo-electric device 111 becomes unstable. Further, the length T of the first supporting means 141 is formed larger than the thickness t of the first lead 132 of the lead part 130, so that the first lead 132 would be strong enough even after the bending of the first supporting means 141, thereby making it possible to prevent an unstable supporting state of the piezo-electric device 111.

Therefore, the piezo-electric device 111 and the capacitor 115 are secured to the first and second terminals 123 and 124 by the help of the first and second supporting means 141 and 142. The process for connecting the piezo-electric device 111 to the first terminals 123 can be carried out in an easy manner with a firm securing result. Consequently, the reliability of the product is upgraded.

Figure 10:
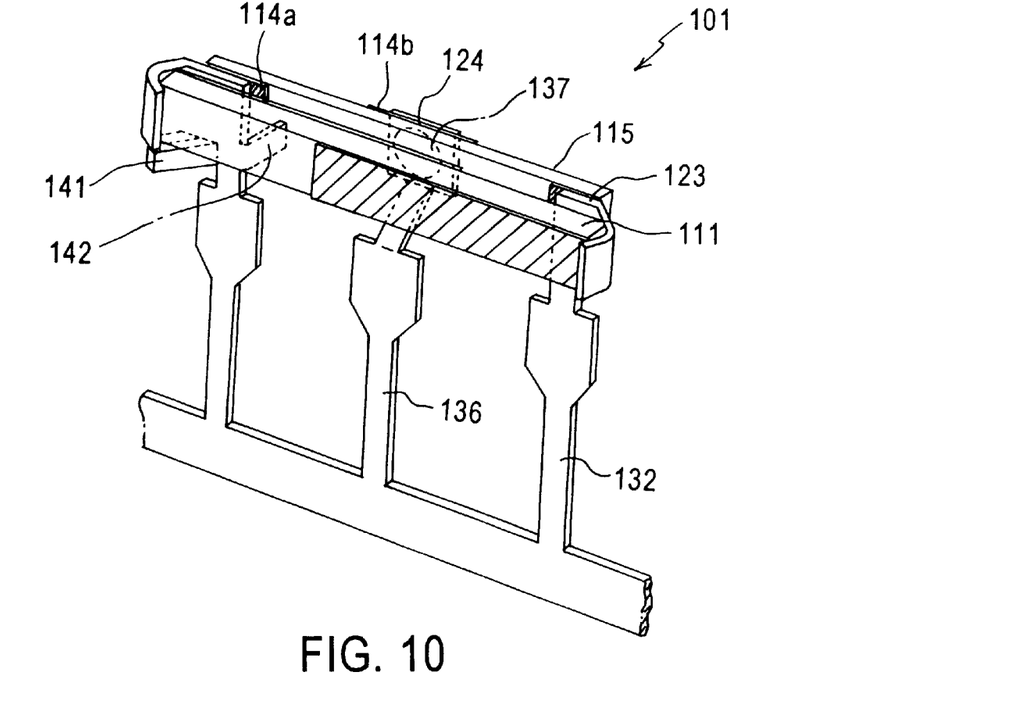
FIG. 10 is a perspective view showing a second embodiment of the present invention.
Figure 11:
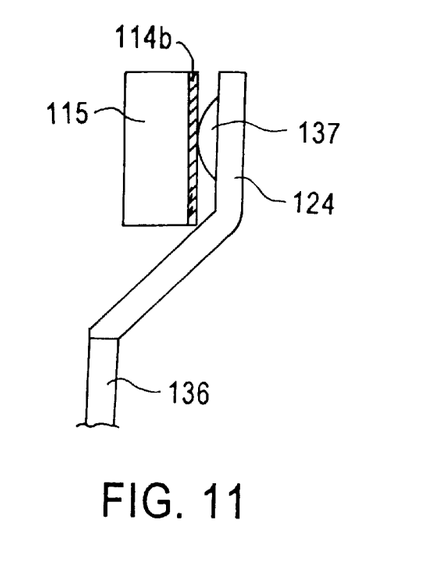
FIG. 11 is a side view of the projection of the second terminal in the second embodiment of the present invention.

FIGS. 10 and 11 illustrate a second embodiment of the present invention. The principal feature of the second embodiment is that a projection 137 is formed on the second terminal 124, so that the second terminal 124 can be easily soldered to the other electrode 114b of the capacitor 115.

As shown in FIGS. 10 and 11, a projection 137 is formed on the second terminal 124 facing the capacitor 115 in an integral form, so that the second terminal 124 can be easily soldered to the other electrode 114b of the capacitor 115. Thus owing to the projection 137 of the second terminal 124, a space is formed between the electrode 114b of the capacitor 115 and the second terminal 124, and therefore, the soldering of the electrode 114b of the capacitor 115 to the second terminal 124 can be easily and firmly carried out.

Figure 12:
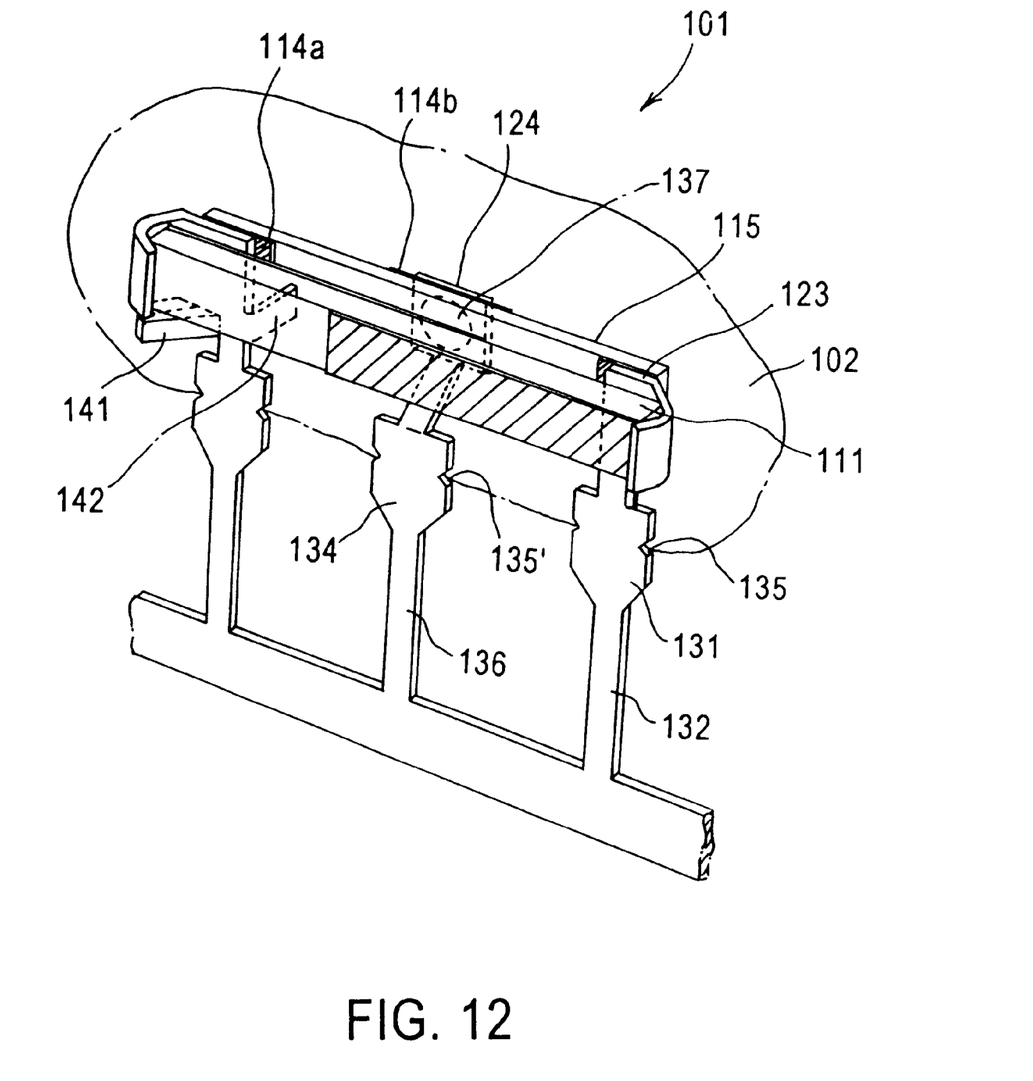
FIG. 12 is a perspective view of a third embodiment of the present invention.

In a third embodiment of the present invention as shown in FIG. 12, triangular slots 135 and 135' are formed on the side edges of the reinforcing portions 131 and 134 which are parts of the first and second leads 132 and 136 of the lead part 130. Therefore, during the molding process, the molding material 102 is filled into the triangular slots 135 and 135'. Owing to the triangular slots 135 and 135', the molding process for the terminal component including the piezo-electric device 111 and the capacitor 115 can be carried out in an easy manner.

As described above, in the third embodiment of the present invention, the triangular slots 135 and 135' are formed on the side edges of the reinforcing portions 131 and 134 which are parts of the first and second leads 132 and 136 of the lead part 130. Therefore, during the molding of the piezo-electric component 101, a molding material 102 is filled into the slots 135 and 135' of the first and second leads 132 and 136. Therefore, when the molding material is solidified, the molding state becomes firm. Further, the worker can resort to the slots 135 and 135' as criteria during the molding operation so as to make it easier to mold the component 101. Further, the molding of the piezo-electric component 101 becomes uniform, thereby improving the aesthetic appearance of the product.

Figure 13:
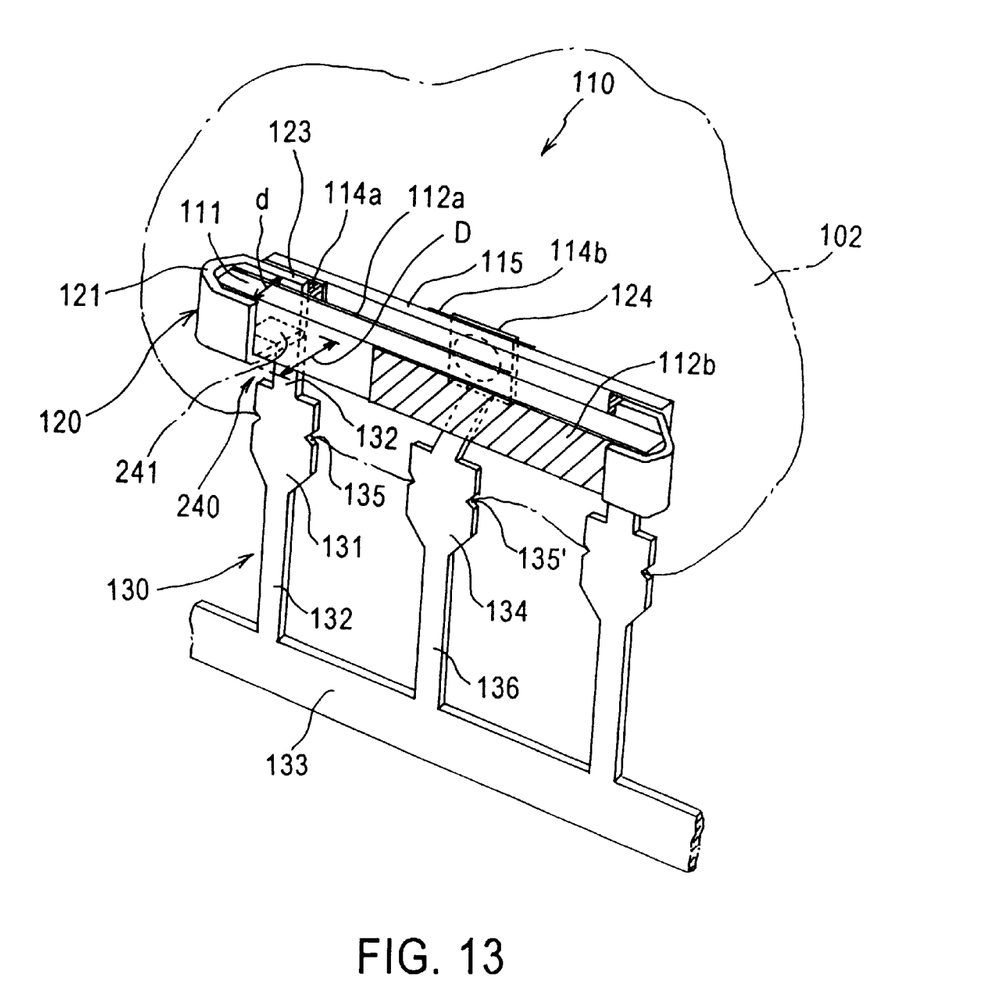
FIG. 13 is a perspective view showing a fourth embodiment of the present invention.
Figure 14:
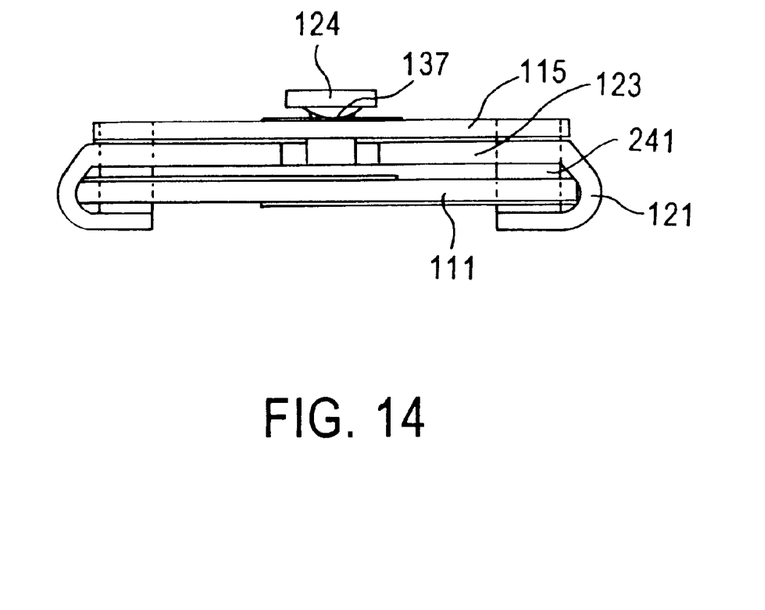
FIG. 14 is a plan view of the fourth embodiment of the present invention.
Figure 15:
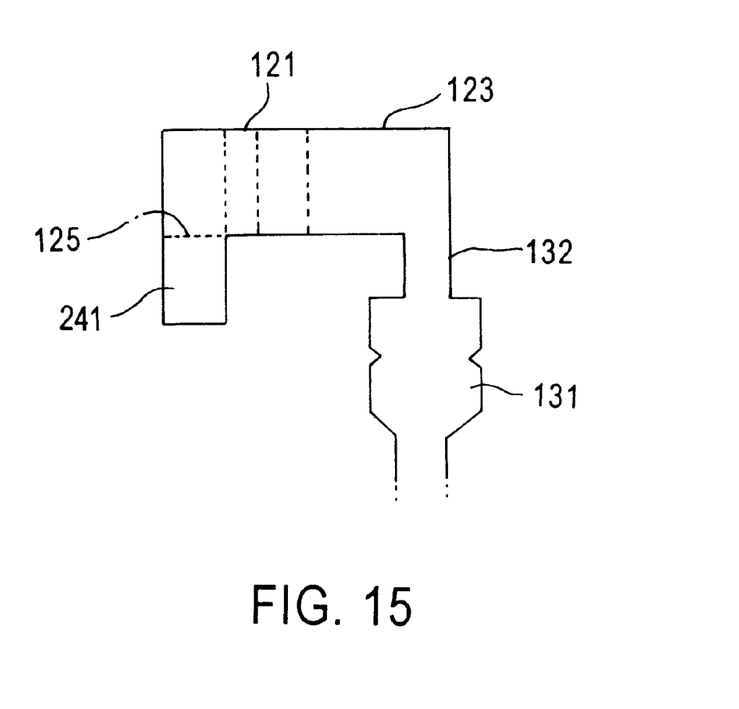
FIG. 15 is an extended view showing the 3-terminal component of the fourth embodiment of the present invention.

FIGS. 13 to 15 illustrate a fourth embodiment of the present invention.

The principal feature of the fourth embodiment of the present invention is as follows. That is, a single supporting means 241 supports the piezo-electric device 111 and the capacitor 115 simultaneously.

The elements same as those of the first embodiment will be assigned with the same reference codes.

As shown in FIGS. 13 to 15, the fourth embodiment of the present invention includes a device part 110, a terminal part 120, a lead part 130 and a supporting part 240. The device part 110, the terminal part 120, and the lead part 130 have the same constitutions as those of the first embodiment.

The supporting part 240 has a supporting means 241 which integrally extends from an outer bottom 125 of the first terminal 123, and then is bent rectangularly inwardly. The length D of the supporting means 241 is designed to be larger than the opening width d of the first terminal 123.

Now the fourth embodiment of the present invention constituted as above will be described as to its action.

As shown in FIGS. 13 to 15, the device part 110, the terminal part 120, and the lead part 130 which are for connecting the piezo-electric device 111 and the capacitor 115 have the same constitutions as those of the first embodiment. A supporting means 241 projects integrally downward from the outer bottom 125 of the first terminal 123, and the length D of the supporting means 241 should be larger than the opening width d of the first terminal 123.

The leading end of the supporting means 241 projects beyond the wall of the first terminal 123, so that the piezo-electric device 111 and the capacitor 115 can be firmly supported.

According to the present invention as described above, the positioning and the electrical connection of the piezo-electric device to the terminals are rendered easier by the supporting means. Further, the piezo-electric device and the capacitor can be firmly and easily supported and connected. Therefore, the manufacturing process for the 3-terminal component becomes simple, and the reliability of the electronic component is upgraded. Further, the molding process becomes uniform, with the result that the aesthetic appearance of the product is improved.

What is claimed is:

1. An electronic component involving a 3-terminal type piezo-electric device, comprising:

a device part having a piezo-electric device formed with electrodes on opposite sides thereof that overlap each other at a middle portion thereof, and having a capacitor with two electrodes on both ends of one face thereof and another electrode at a center of another face thereof;

a terminal part having a pair of first terminals, each first terminal including a terminal and a bent portion projecting from a side portion of said terminal, said bent portion having a rounded V-shape in top plan view, opposite ends of said piezo-electric device being respectively received within the rounded V-shape of each said bent portion in respective electrical contact with said electrodes of said piezo-electric device, an outer surface of each said terminal being in respective electrical contact with an electrode of said capacitor, and having a second terminal for being electrically connected to an electrode of another face of said capacitor;

a lead part having first and second leads extending downward from lower ends of an associated terminal, a terminal connecting portion located between an associated terminal and first lead to connect the same together and a frame for integrally connecting lower ends of said first and second leads; and a supporting part having a pair of first supports respectively disposed to define a bottom within the rounded V-shape of each terminal which supports a respective opposite end of said piezo-electric device, each first support being integrally formed to extend from said connecting portion and a second support extending outward from a respective said terminal of said first terminals to support an opposite end of the capacitor.

2. The electronic component as claimed in claim 1, wherein each said first support has a length longer than a thickness of said first lead.

3. An electronic component involving a 3-terminal type piezo-electric device, comprising:

a device part having a piezo-electric device formed with electrodes on opposite sides thereof that overlap each other at a middle portion thereof, and having a capacitor with two electrodes on both ends of one face thereof and another electrode at a center of another face thereof;

a terminal part having a pair of first terminals, each first terminal including a terminal and a bent portion projecting from a side portion of said terminal, said bent portion having a rounded V-shape in top plan view, opposite ends of said piezo-electric device being respectively received within the rounded V-shape of each said bent portion in respective electrical contact with said electrodes of said piezo-electric device an outer surface of each said terminal being in respective electrical contact with an electrode of said capacitor, and having a second terminal for bring electrically connected to an electrode of another face of said capacitor;

a lead part having first and second leads extending downward from lower ends of an associated terminal, a terminal connecting portion located between an associated terminal and first lead to connect the same together and a frame for integrally connecting lower ends of said first and second leads; and a supporting part having a pair of first supports respectively disposed to define a bottom within the rounded V-shape of each terminal which supports a respective opposite end of said piezo-electric device, each first support being integrally formed to extend from said connecting portion, and a second support extending outward from a respective said terminal of said first terminals to support an opposite end of the capacitor;

wherein a projection is formed at a center of a tip portion of said second terminal for facilitating a connection of said second terminal to another electrode of said capacitor.

4. The electronic component as claimed in claim 3, wherein said projection of said second terminal is soldered to said capacitor.

5. An electronic component involving a 3-terminal type piezo-electric device, comprising:

a device part having a piezo-electric device formed with electrodes on opposite sides thereof that overlap each other at a middle portion thereof, and having a capacitor with two electrodes on both ends of one face thereof and another electrode at a center of another face thereof;

a terminal part having a pair of first terminals, each first terminal including a terminal and a bent portion protecting from a side portion of said terminal, said bent portion having a rounded V-shape in top plan view, opposite ends of said piezo-electric device being respectively received within the rounded V-shape of each said bent portion in respective electrical contact with said electrodes of said piezo-electric device, an outer surface of each said terminal being in respective electrical contact with an electrode of said capacitor, and having a second terminal for bring electrically connected to an electrode of another face of said capacitor;

a lead part having first and second leads extending downward from lower ends of an associated terminal, a terminal connecting portion located between an associated terminal and first lead to connect the same together and a frame for integrally connecting lower ends of said first and second leads; and a supporting part having a pair of first supports respectively disposed to define a bottom within the rounded V-shape of each terminal which supports a respective opposite end of said piezo-electric device, each first support being integrally formed to extend from said connecting portion, and a second support extending outward from a respective said terminal of said first terminals to support an opposite end of the capacitor;

wherein said first and second leads have reinforcing portions about middle thereof.

6. The electronic component as claimed in claim 5, wherein said reinforcing portions of said first and second leads have triangular slots about middles of their edges.

7. An electronic component involving a 3-terminal type piezo-electric device, comprising:

a device part having a piezo-electric device formed with electrodes on opposite sides thereof that overlap each other at a middle portion, and having a capacitor with two electrodes on both ends of one face thereof and another electrode at a center of another face thereof;

a terminal part having a pair of first terminals, each first terminal including a terminal and a bent portion projecting from a side portion of said terminal, said bent portion having a rounded V-shape in top plan view, opposite ends of said piezo-electric device being respectively received within the rounded V-shape of each said bent portion in respective electrical contact with said electrodes of said piezo-electric device, an outer surface of each said terminal being in respective electrical contact with an electrode of said capacitor, and having a second terminal for being electrically connected to an electrode of another face of said capacitor;

a lead part having first and second leads extending downward from lower ends of an associated terminal, a terminal connecting portion located between an associated terminal and first lead to connect the same together and a frame for integrally connecting lower ends of said first and second leads; and a first support extending within said rounded V-shape to define a bottom thereof adapted to support an associated end of said piezo-electric device, said first support being formed from an outer planar portion of said bent portion and extending as another bent portion inwardly from said outer portion towards said associated terminal.

8. The electronic component as claimed in claim 7, wherein said first support has a length which is larger than an opening width of said associated rounded V-shape, said first support thereby extending, beneath a lower edge of said terminal to extend outwardly from an outer face of said terminal to define a second support adapted to receive associated end of said capacitor in supporting contact therewith.

* * * * *